(12) United States Patent
Nam et al.

(10) Patent No.: US 10,515,592 B2
(45) Date of Patent: Dec. 24, 2019

(54) DISPLAY DEVICE AND A METHOD OF DRIVING A GATE DRIVER

(71) Applicant: SAMSUNG DISPLAY CO., LTD., Yongin-si, Gyeonggi-Do (KR)

(72) Inventors: Yanguk Nam, Hwaseong-si (KR); Dae-sik Lee, Hwaseong-si (KR); Yoomi Kim, Hanam-si (KR); Junghwan Hwang, Yongin-si (KR)

(73) Assignee: SAMSUNG ELECTRONICS CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/043,739

(22) Filed: Jul. 24, 2018

(65) Prior Publication Data

US 2019/0122611 A1 Apr. 25, 2019

(30) Foreign Application Priority Data

Oct. 23, 2017 (KR) .......................... 10-2017-0137691
Jul. 6, 2018 (KR) .......................... 10-2018-0078831

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *G09G 3/3696* (2013.01);
(Continued)

(58) Field of Classification Search
CPC .. G09G 3/3258; G09G 3/3696; G09G 3/3233; G09G 2330/04; G09G 2330/025; G09G 2330/045; G09G 2310/06; G09G 2330/028; G09G 2310/08; G09G 2310/0264

See application file for complete search history.

(56) References Cited

U.S. PATENT DOCUMENTS 9,570,027 B2 2/2017 Kim et al.
2011/0018845 A1* 1/2011 Mizunaga ............ G09G 3/3677
345/204

(Continued)

FOREIGN PATENT DOCUMENTS

KR 10-1662395 9/2016

*Primary Examiner* — Md Saiful A Siddiqui
(74) *Attorney, Agent, or Firm* — F. Chau & Associates, LLC

(57) ABSTRACT

A display device includes: a display panel including data lines, gate lines, and pixels, the display panel is operated in an active period or in a blank period; and a driving circuit for driving the display panel, the driving circuit including: a signal controller for outputting clock control signals; a voltage generator for receiving the clock control signals, wherein the voltage generator outputs active clock signals synchronized with the clock control signals during the active period and outputs blank clock signals during the blank period; and an overcurrent detection circuit for receiving the clock control signals and the blank clock signals, the overcurrent detection circuit detects an overcurrent of the blank clock signals, and a phase difference between the clock control signals in the active period is different from a phase difference between the clock control signals in the blank period.

20 Claims, 9 Drawing Sheets

(51) Int. Cl.
*H01L 27/32* (2006.01)
*G09G 3/36* (2006.01)

(52) U.S. Cl.
CPC . *H01L 27/3276* (2013.01); *G09G 2310/0264* (2013.01); *G09G 2310/06* (2013.01); *G09G 2310/08* (2013.01); *G09G 2330/025* (2013.01); *G09G 2330/028* (2013.01); *G09G 2330/04* (2013.01); *G09G 2330/045* (2013.01)

(56) References Cited

U.S. PATENT DOCUMENTS

| | | | |
|---|---|---|---|
| 2012/0307867 A1* | 12/2012 | Chung | G01K 7/32 374/170 |
| 2016/0104443 A1* | 4/2016 | Lee | G09G 3/3648 345/209 |
| 2016/0125800 A1* | 5/2016 | Kim | G09G 3/3225 345/212 |
| 2016/0240144 A1* | 8/2016 | Song | G09G 3/3233 |

* cited by examiner

DISPLAY DEVICE AND A METHOD OF DRIVING A GATE DRIVER

CROSS-REFERENCE TO RELATED APPLICATIONS

This U.S. non-provisional patent application claims priority under 35 U.S.C. § 119 to Korean Patent Application No. 10-2017-0137691, filed on Oct. 23, 2017 and Korean Patent Application No. 10-2018-0078831, filed on Jul. 6, 2018, the disclosures of which are incorporated by reference herein in their entireties.

TECHNICAL FIELD

The present inventive concept relates to a method of driving a gate driver from an overcurrent and a display device having the gate driver.

DESCRIPTION OF THE RELATED ART

A display device includes a display panel for displaying an image and a driving circuit for driving the display panel. The display panel includes gate lines, data lines, and pixels. The driving circuit generates various driving voltages to operate the display panel. To display an image via the pixels, the driving voltages at a high voltage level are applied to the gate lines and the data lines.

When there is a short circuit between wirings through which the driving voltages are provided, an overcurrent may flow to the wirings. In this case, the display panel can malfunction. In addition, the wirings are at risk of being burnt.

SUMMARY

Exemplary embodiments of the inventive concept provide a display device including a display panel including a plurality of data lines, a plurality of gate lines, and a plurality of pixels, wherein the display panel is operated in an active period in which a data driving signal is applied to the pixels through the data lines or in a blank period in which the data driving signal is not applied to the pixels and a driving circuit for driving the display panel. The driving circuit includes a signal controller for outputting a plurality of clock control signals, a voltage generator for receiving the clock control signals, wherein the voltage generator outputs a plurality of active clock signals synchronized with the clock control signals during the active period and outputs a plurality of blank clock signals during the blank period, and an overcurrent detection circuit for receiving the clock control signals and the blank clock signals, wherein the overcurrent detection circuit detects an overcurrent of the blank clock signals. A phase difference between the clock control signals in the active period is different from a phase difference between the clock control signals in the blank period.

When a rising time point of a first clock control signal is a first rising time point and a rising time point of a second clock control signal that rises at a time point nearest to and after the first rising time point is a second rising time point, a first time difference between the first rising time point and the second rising time point in the active period is smaller than a second time difference between the first rising time point and the second rising time point in the blank period.

After the blank period is entered, the second clock control signal first rises after a first delay time and a third clock control signal subsequent to the second clock control signal first rises after a second delay time.

Each of the first and second clock control signals has a low level for a time equal to or greater than the first time difference of the blank period before the active period begins.

A duty ratio of a high level of each the first and second clock control signals in the active period is smaller than a duty ratio of a high level of each of the first and second clock control signals in the blank period.

The overcurrent detection circuit detects the overcurrent during a time between the first rising time point and a falling time point of the second clock control signal that falls at a time point nearest to and after the first rising time point.

The overcurrent detection circuit counts a signal at a detection time after a first time elapses from the first rising time point, wherein the counted signal indicates that a current level of a first clock signal is higher than an overcurrent reference current level.

The detection time is a detection period, and the detection period is a period between the first rising time point and the falling time point in the blank period.

The blank clock signals include a first blank clock signal and a second blank clock signal, and the first blank clock signal has a voltage level different from a voltage level of the second blank clock signal.

The blank period includes a masking period and an overcurrent detection period, the blank clock signals have a low level during the masking period, and the first blank clock signal has a high level and the second blank clock signal has a low level in the overcurrent detection period.

The first blank clock signal in a first frame and the second blank clock signal in a second frame have a same level as each other, and the second blank clock signal in the first frame and the first blank clock signal in the second frame have a same level as each other.

The overcurrent detection circuit counts a number of overcurrent detections and activates an overcurrent detection signal when the number of overcurrent detections is equal to or greater than a reference number, and the voltage generator stops generating the driving voltage in response to the overcurrent detection signal.

Exemplary embodiments of the inventive concept provide a display device including a display panel including a plurality of data lines, a plurality of gate lines, and a plurality of pixels, wherein the display panel is operated in an active period in which a data driving signal is applied to the pixels through the data lines or in a blank period in which the data driving signal is not applied to the pixels and a driving circuit for driving the display panel. The driving circuit includes a signal controller for outputting a plurality of clock control signals, a voltage generator for receiving the clock control signals, wherein the voltage generator outputs a plurality of active clock signals synchronized with the clock control signals during the active period and outputs a plurality of blank clock signals during the blank period, and an overcurrent detection circuit for receiving the clock control signals and the blank clock signals, wherein the overcurrent detection circuit detects an overcurrent of the blank clock signals. A time difference between a rising time point of a first clock control signal and a falling time point of a second clock control signal that falls at a time point nearest to and after the rising time point is greater in the blank period than in the active period.

A frequency of each of the first and second clock control signals in the blank period is lower than a frequency of each of the first and second clock control signals in the active period.

A phase difference between each of the first and second clock control signals in the active period is different from a phase difference between each of the first and second clock control signals in the blank period.

Exemplary embodiments of the inventive concept provide a method of driving a gate driver of a display panel, which includes a plurality of data lines, a plurality of gate lines, and a plurality of pixels, wherein the display panel is operated in an active period in which a data driving signal is applied to the pixels through the data lines or in a blank period in which the data driving signal is not applied to the pixels, the method including receiving a plurality of clock control signals having phase differences different from each other in the active period and the blank period, generating a plurality of active clock signals synchronized with the clock control signals in the active period, generating a plurality of blank clock signals in the blank period, detecting an overcurrent of the blank clock signals in response to the clock control signals and the blank clock signals, and activating an overcurrent detection signal when a number of overcurrent detections exceeds a reference number.

After the blank period is entered, each of first, second and third clock control signals has a first rise time, and the first rise time of each of the second and third clock control signals is delayed.

A first duty ratio of a high level of the clock control signals in the active period is smaller than a second duty ratio of a high level of the clock control signals in the blank period.

The blank clock signals are generated in synchronization with the clock control signals in the blank period.

The generating of the blank clock signals includes generating a first blank clock signal having a first voltage level and generating a second blank clock signal having a second voltage level different from the first voltage level.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, exemplary embodiments of the present inventive concept will be explained in detail with reference to the accompanying drawings. The inventive concept may, however, be embodied in different forms and should not be construed as being limited to the embodiments set forth herein. Like numerals may refer to like elements throughout the specification.

Figure 1:
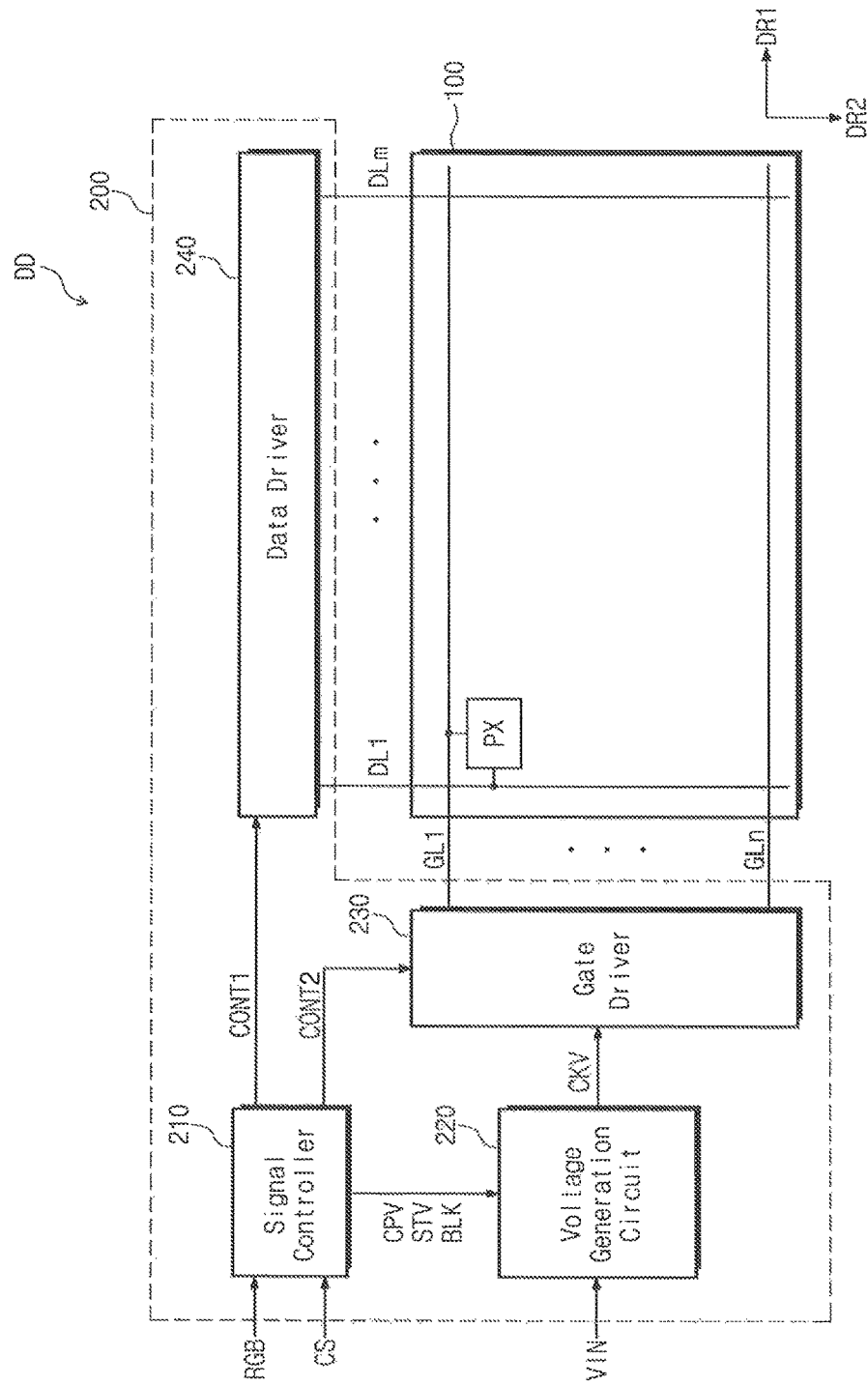
FIG. 1 is a block diagram showing a display device according to an exemplary embodiment of the present inventive concept.

FIG. 1 is a block diagram showing a display device DD according to an exemplary embodiment of the present inventive concept.

Referring to FIG. 1, the display device DD includes a display panel 100 and a driving circuit 200. The driving circuit 200 includes a signal controller 210, a voltage generation circuit 220, a gate driver 230, and a data driver 240. The signal controller 210, the voltage generation circuit 220, the gate driver 230, and the data driver 240 may be used to drive the display panel 100.

The display panel 100 may be one of various display panels, such as an organic light emitting display panel, a liquid crystal display panel, a plasma display panel, an electrophoretic display panel, an electrowetting display panel, etc.

The display panel 100 includes a plurality of data lines DL1 to DLm, a plurality of gate lines GL1 to GLn, and a plurality of pixels PX.

The gate lines GL1 to GLn extend in a first direction DR1 and are arranged in a second direction DR2 crossing the first direction DR1. For example, the gate lines GL1 to GLn extend lengthwise in the first direction DR1. The data lines DL1 to DLm extend in the second direction DR2 and are arranged in the first direction DR1. For example, the data lines DL1 to DLm extend lengthwise in the second direction DR2. The data lines DL1 to DLm and the gate lines GL1 to GLn may define pixel areas, and the pixels PX are disposed in the pixel areas, respectively. FIG. 1 shows a pixel PX connected to a first data line DL1 and a first gate line GL1 as a representative example.

The pixel PX may display one of the primary colors or a mixture of the primary colors. The primary colors may include a red color, a green color, and a blue color, and the mixture of the primary colors may include various colors, e.g., a white color, a yellow color, a cyan color, a magenta color, etc. However, the colors displayed by the pixels PX are not limited thereto.

The signal controller 210 (or a timing controller) receives a control signal CS and image data RGB from an external source. The signal controller 210 applies a first control signal CONT1 to the data driver 240 and applies a second control signal CONT2 to the gate driver 230. The first control signal CONT1 is used to drive the data driver 240, and the second control signal CONT2 is used to drive the gate driver 230.

The data driver 240 drives the data lines DL1 to DLm in response to the first control signal CONT1 provided from the signal controller 210. The data driver 240 may be electrically connected to one side portion of the display panel 100. The data driver 240 may be an independent integrated circuit or directly mounted on the display panel 100. In addition, the data driver 240 may be a single chip or may include a plurality of chips.

The gate driver 230 drives the gate lines GL1 to GLn in response to the second control signal CONT2 provided from the signal controller 210. The gate driver 230 may be integrated in a predetermined area of the display panel 100. In this case, the gate driver 230 may be implemented in a circuit using an amorphous silicon gate of an amorphous silicon thin film transistor, an oxide semiconductor, a crystalline semiconductor, a polycrystalline semiconductor, and the like. In addition, the gate driver 230 may be electrically connected to one side portion of the display panel 100. In this case, the gate driver 230 may be an independent integrated circuit. According to an exemplary embodiment of the inventive concept, the gate driver 230 may be implemented in a tape carrier package (TCP) or a chip-on-film (COF).

A switching transistor of each of the pixels PX arranged in one row and connected to one gate line among the gate lines GL1 to GLn is turned on during a time period in which a gate-on voltage is applied to the one gate line. In this case, the data driver 240 applies data driving signals corresponding to image data signals included in the first control signal CONT1 to the data lines DL1 to DLm. The data driving signals applied to the data lines DL1 to DLm are respectively applied to the pixels PX through the turned-on switching transistors.

The display panel 100 may be operated in an active period during which the display panel 100 receives the data driving signals or in a blank period during which the display panel 100 does not receive the data driving signals. For example, the active period may correspond to a period in which the data driving signals applied to the data lines DL1 to DLm are applied to the pixels PX through the turned-on switching transistors. In addition, the blank period does not influence a display quality of the display panel 100. This is so, because the data driving signals are not applied to the data lines DL1 to DLm during the blank period.

The voltage generation circuit 220 receives a power voltage VIN from an external source and receives a clock control signal CPV, a vertical start signal STV, and a blank signal BLK from the signal controller 210. The vertical start signal STV indicates a start of one frame, and the blank signal BLK is maintained in an active state (e.g., a low level) during the blank period in which the data driver 240 does not drive the data lines DL1 to DLm within one frame.

The voltage generation circuit 220 may generate the driving voltages in response to the clock control signal CPV, the vertical start signal STV, and the blank signal BLK. As an example, the driving voltages may include an analog power voltage, a gamma voltage, the gate-on voltage, a gate-off voltage, a ground voltage, a common voltage, and the like. However, the driving voltages are not limited thereto. In addition, the voltage generation circuit 220 may further include terminals to output the driving voltages.

The voltage generation circuit 220 may generate clock signals CKV based on the generated driving voltages. An individual clock signal CKV may have a waveform with a gate-on voltage level and a gate-off voltage level.

Figure 2:
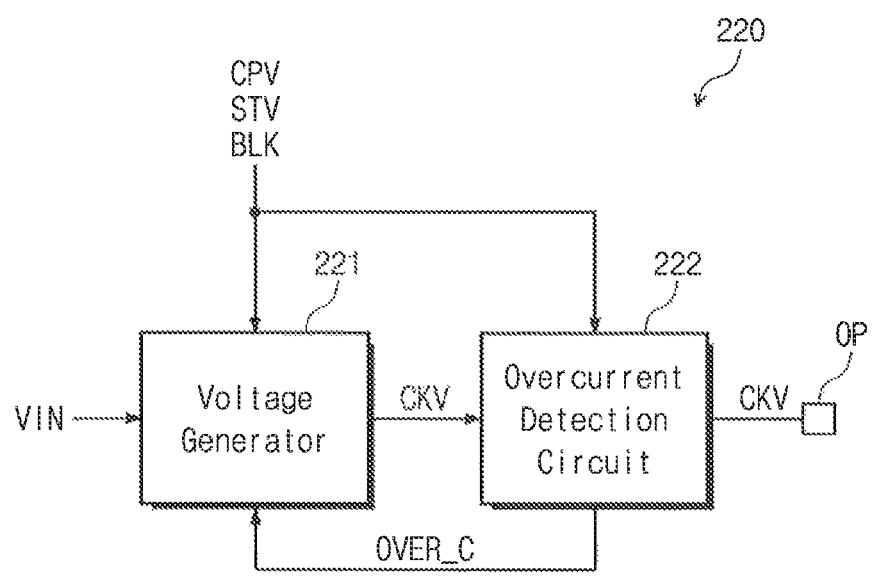
FIG. 2 is a block diagram showing a voltage generator according to an exemplary embodiment of the present inventive concept.
Figure 3:
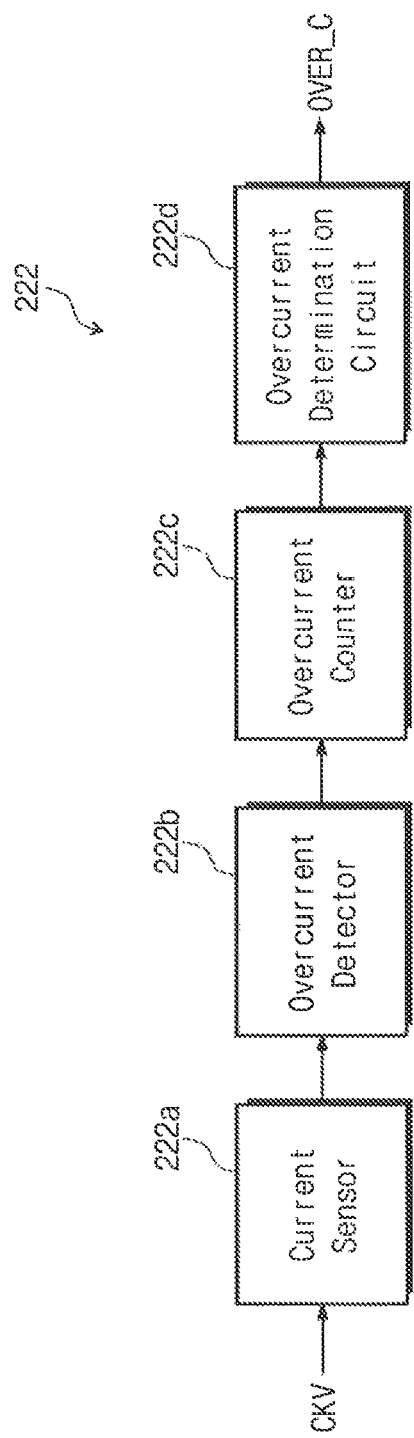
FIG. 3 is a block diagram showing an overcurrent detection circuit according to an exemplary embodiment of the present inventive concept.

FIG. 2 is a block diagram showing the voltage generation circuit 220 according to an exemplary embodiment of the present inventive concept, and FIG. 3 is a block diagram showing an overcurrent detection circuit according to an exemplary embodiment of the present inventive concept.

Referring to FIGS. 2 and 3, the voltage generation circuit 220 includes a voltage generator 221 and an overcurrent detection circuit 222.

The voltage generator 221 receives the power voltage VIN and the clock control signal CPV and converts the clock control signal CPV to the clock signal CKV to output the clock signal CKV. The overcurrent detection circuit 222 detects an output current of the clock signal CKV flowing through a voltage terminal OP and outputs an overcurrent detection signal OVER_C.

The overcurrent detection circuit 222 includes a current sensor 222a, an overcurrent detector 222b, an overcurrent counter 222c, and an overcurrent determination circuit 222d.

The current sensor 222a senses an output current of the clock signal CKV output through the voltage terminal OP.

The overcurrent detector 222b determines whether a current level of the clock signal CKV is higher than an overcurrent reference current level. The overcurrent detector 222b may be operated in both of the active period and the blank period, or only in the blank period, for example.

The overcurrent counter 222c counts a signal, which indicates that the current level of the clock signal CKV is higher than the overcurrent reference current level, output from the overcurrent detector 222b. The overcurrent counter 222c is initialized every predetermined period.

When the number of overcurrents counted by the overcurrent counter 222c exceeds the number of reference counts, the overcurrent determination circuit 222d determines that the output current of the clock signal CKV is in an overcurrent state and activates the overcurrent detection signal OVER_C.

The voltage generator 221 receives the overcurrent detection signal OVER_C from the overcurrent determination circuit 222d. When the overcurrent detection signal OVER_C is activated (e.g., the overcurrent detection signal OVER_C is at the high level), the voltage generator 221 may stop generating inner driving voltages. In other words, the voltage generator 221 stops generating the driving voltages to be output to the voltage terminal OP, and thus, the display panel 100 shown in FIG. 1 may be prevented from malfunctioning. In addition, the display panel 100 may be prevented from becoming defective due to a high temperature and may also reduce a risk of fire.

Figure 4:
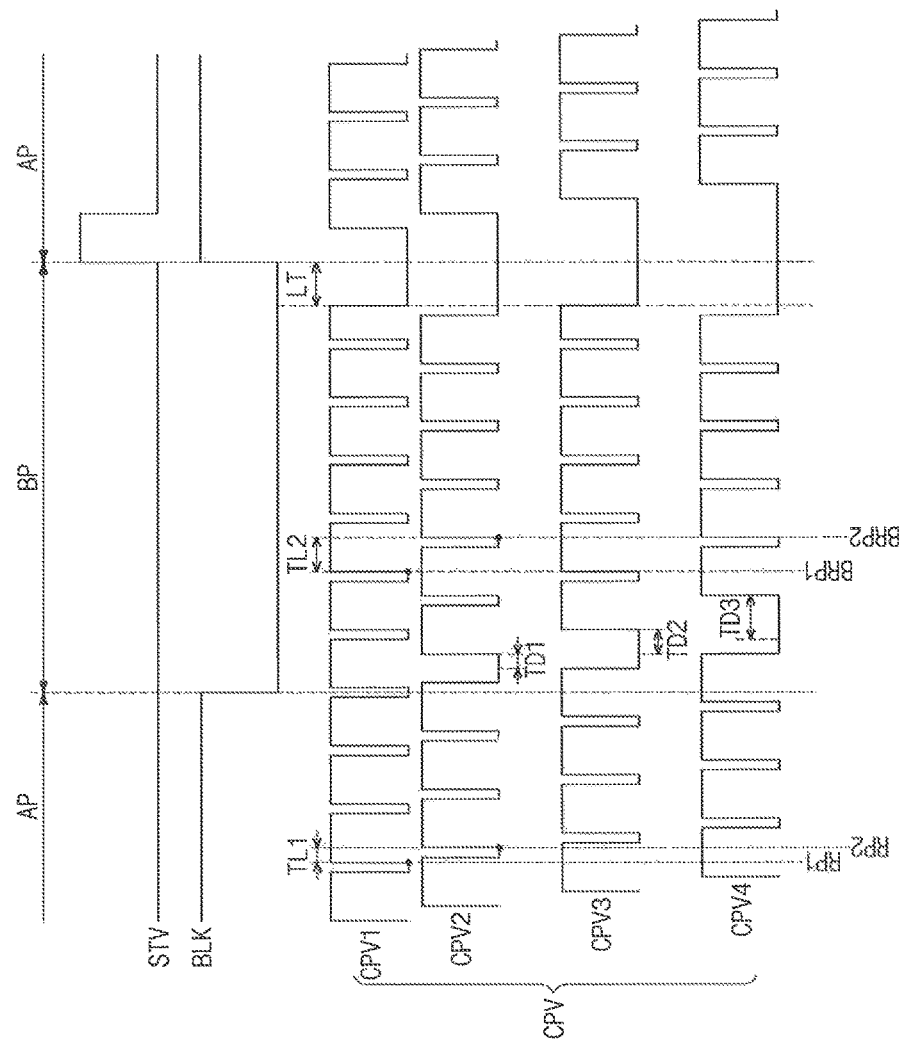
FIG. 4 is a timing diagram showing some signals output from a signal controller according to an exemplary embodiment of the present inventive concept.

FIG. 4 is a timing diagram showing some signals output from the signal controller 210 according to an exemplary embodiment of the present inventive concept. FIG. 4 shows the vertical start signal STV, the blank signal BLK, and the clock control signal CPV.

The clock control signal CPV may be provided in a plural number. For example, the clock control signal CPV may include first, second, third, and fourth clock control signals CPV1, CPV2, CPV3, and CPV4 having different phases from each other. However, the inventive concept is not limited thereto. For instance, the clock control signal CPV may include three or sixth clock control signals having different phases from each other.

A difference in phase between the first, second, third, and fourth clock control signals CPV1, CPV2, CPV3, and CPV4 in the active period AP may be different from a difference in phase between the first, second, third, and fourth clock control signals CPV1, CPV2, CPV3, and CPV4 in the blank period BP.

According to the exemplary embodiment of the present inventive concept, a reliability of the overcurrent detection performed by the overcurrent detection circuit 222 may be increased by controlling the phase difference between the first, second, third, and fourth clock control signals CPV1, CPV2, CPV3, and CPV4 in the blank period BP.

Among the first, second, third, and fourth clock control signals CPV1, CPV2, CPV3, and CPV4, a rising time point of a k-th clock signal may be referred to as a "first rising time point", and a rising time point of a (k+1)th clock signal rising at a time point nearest the first time rising time point may be referred to as a "second rising time point". "k" may be an integer equal to or greater than 1. In the present exemplary embodiment, when "k" is 4, the (k+1)th clock control signal may be the first clock control signal CPV1, and when "k" is 5, the (k+1)th clock control signal may be the second clock control signal CPV2.

Hereinafter, a case in which "k" is 1 will be described as a representative example. In FIG. 4, a first rising time point RP1 of the first clock control signal CPV1 and a second rising time point RP2 of the second clock control signal CPV2 in the active period AP are shown. In addition, a first rising time point BRP1 of the first clock control signal CPV1 and a second rising time point BRP2 of the second clock control signal CPV2 in the blank period BP are shown in FIG. 4.

A difference in time between the first rising time point RP1 and the second rising time point RP2 may be referred to as a "first time difference TL1", and a difference in time between the first rising time point BRP1 and the second rising time point BRP2 may be referred to as a "second time difference TL2". Here, the first time difference TL1 is different from the second time difference TL2, and the second time difference TL2 is greater than the first time difference TL1. As an example, the second time difference TL2 may be two times greater than the first time difference TL1. In other words, the phase difference between the first, second, third, and fourth clock control signals CPV1, CPV2, CPV3, and CPV4 in the blank period BP may be greater than the phase difference between the first, second, third, and fourth clock control signals CPV1, CPV2, CPV3, and CPV4 in the active period AP.

After a time point at which the blank period BP is entered, a first rising time point of each of the clock control signals except for a clock control signal that first rises among the first, second, third, and fourth clock control signals CPV1, CPV2, CPV3, and CPV4 may be delayed. The clock control signal that first rises in the blank period BP of FIG. 4 is the first clock control signal CPV1. Accordingly, the first rising time point of the second, third, and fourth clock control signals CPV2, CPV3, and CPV4 may be delayed.

The first rising time point of the second clock control signal CPV2 may be delayed by a first time TD1, the first rising time point of the third clock control signal CPV3 may be delayed by a second time TD2, and the first rising time point of the fourth clock control signal CPV4 may be delayed by a third time TD3.

When the second time difference TL2 is two times greater than the first time difference TL1, the first time TD1 may be the same as the first time difference TL1, the second time TD2 may be two times greater than the first time difference TL1, and the third time TD3 may be three times greater than the first time difference TL1. In other words, the delay times TD1, TD2 and TD3 may sequentially increase.

After the first rising time point of the second, third, and fourth clock control signals CPV2, CPV3, and CPV4 is delayed, a waveform and a duty ratio of each of the first, second, third, and fourth clock control signals CPV1, CPV2, CPV3, and CPV4 are constant in the active period AP and the blank period BP.

Although the first rising time point of each of the second, third, and fourth clock control signals CPV2, CPV3, and CPV4 are delayed in the blank period BP, these delays do not impact image quality since the blank period BP is not a period in which signals for the image are received.

The clock control signal CPV may maintain a low level during a predetermined period LT of the blank period BP before the active period AP begins. Accordingly, the clock signals CKV (refer to FIG. 1) may be prevented from being repeatedly output at the beginning of the active period AP. The predetermined period LT may have a length equal to or greater than the first time difference TL1.

Figure 5:
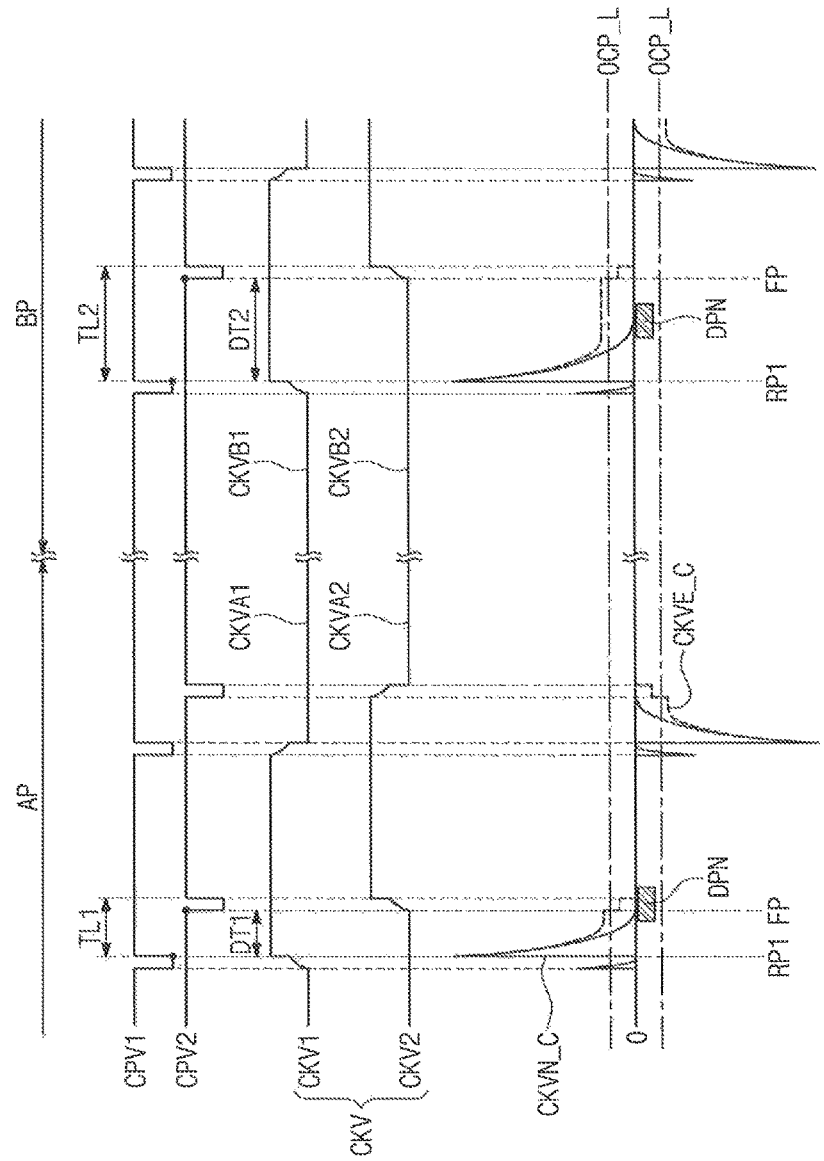
FIG. 5 is a timing diagram showing clock control signals, clock signals, and a current level of a clock signal according to an exemplary embodiment of the present inventive concept.

FIG. 5 is a timing diagram showing the clock control signals, the clock signals, and a current level of the clock signal according to an exemplary embodiment of the present inventive concept.

FIG. 5 shows the first clock control signal CPV1, the second clock control signal CPV2, and the clock signal CKV. The first clock control signal CPV1 and the second clock control signal CPV2 are the same as the first clock control signal CPV1 and the second clock control signal CPV2 shown in FIG. 4. However, the first clock control signal CPV1 and the second clock control signal CPV2 shown in FIG. 5 have different duty ratios from those of the first clock control signal CPV1 and the second clock control signal CPV2 shown in FIG. 4.

In FIG. 5, only first and second clock signals CKV1 and CKV2 are shown, but the clock signal CKV may include more than two clock signals. In addition, the clock signal CKV may further include a first clock bar signal and a second clock bar signal having a phase opposite to that of the first clock signal CKV1 and the second clock signal CKV2.

When the first clock control signal CPV1 has a falling edge, the voltage level of the first clock signal CKV1 rises, and when the first clock control signal CPV1 has a rising edge, the voltage level of the first clock signal CKV1 rises again. When the first clock control signal CPV1 has the falling edge after being maintained at a certain voltage level, the voltage level of the first clock signal CKV1 falls, and when the first clock control signal CPV1 has the rising edge after having the falling edge after being maintained, the voltage level of the first clock signal CKV1 falls again. When the first clock signal CKV1 initially rises or falls, it may rise or fall to a charge share voltage having an intermediate level. This way, the voltage level of the first clock signal CKV1 may be stepwise changed. The second clock signal CKV2 operates in the same manner as the first clock signal CKV1, and thus, detailed descriptions of the second clock signal CKV2 will be omitted.

The first clock signal CKV1 is divided into a first active clock signal CKVA1 output during the active period AP and a first blank clock signal CKVB1 output during the blank period BP. The second clock signal CKV2 is divided into a second active clock signal CKVA2 output during the active period AP and a second blank clock signal CKVB2 output during the blank period BP.

In the exemplary embodiment shown in FIG. 5, the first active clock signal CKVA1 and the first blank clock signal CKVB1 are generated in synchronization with the first clock control signal CPV1, and the second active clock signal CKVA2 and the second blank clock signal CKVB2 are generated in synchronization with the second clock control signal CPV2.

FIG. 5 shows an output current of the first clock signal CKV1. The current represented by a solid line indicates a normal output current CKVN_C, and the current represented by a dotted line indicates an abnormal output current CKVE_C.

Regarding the normal output current CKVN_C, the current flows depending on the change of the voltage when the first clock signal CKV first rises, second rises, first falls, and second falls. In addition, when the voltage level of the first clock signal CKV1 starts to be maintained, the normal output current CKVN_C converges to zero (0).

However, when a short circuit occurs between the voltage terminal to which the first clock signal CKV1 is applied and the voltage terminal to which the second clock signal CKV2 is applied, the abnormal output current E_C may not converge to zero (0) even though the voltage level of the first clock signal CKV1 is maintained. In the above description, the expression that "a short circuit occurs between the voltage terminals" may mean that the short circuit occurs between the voltage terminals, and also that the short circuit occurs between components, e.g., driving lines, connected to terminals.

The abnormal output current CKVE_C may be a current generated when a current flows between a terminal to which the first clock signal CKV1 is applied and a terminal to which the second clock signal CKV2 is applied. However, the abnormal output current CKVE_C is not limited thereto.

When the voltage level of the first clock signal CKV1 starts to be maintained, the normal output current CKVN_C is supposed to converge to zero (0). However, since a difference in voltage level exists between the terminal to which the first clock signal CKV1 is applied and the terminal to which the second clock signal CKV2 is applied, the abnormal output current CKVE_C is maintained at a predetermined level without converging to zero (0).

When the second clock signal CKV2 first rises, the difference in voltage level between the first clock signal CKV1 and the second clock signal CKV2 is reduced by half, and thus, a current value of the abnormal output current CKVE_C is reduced. When the second clock signal CKV2 rises for the second time and the voltage level of the first clock signal CKV1 becomes equal to the voltage level of the second clock signal CKV2, the abnormal output current CKVE_C becomes zero (0).

Since the current value of the abnormal output current CKVE_C is reduced when the second clock signal CKV2 first rises, the detection of the overcurrent may be carried out during periods DT1 and DT2. Period DT1 occurs between the first rising time point RP1 of the first clock control signal CPV1 and the falling point FP of the second clock control signal CPV2. The falling point FP of the second clock control signal CPV2 corresponds to the first level drop of the second clock control signal CPV2 after the first rising time point RP1. For example, in FIG. 5, the falling point FP occurs when CPV2 goes low and DT1 ends. Period DT2 occurs between yet another first rising time point RP1 of the first clock control signal CPV1 and yet another falling point FP of the second clock control signal CPV2. The rising time point RP1 and falling point FP of period DT2 are shown to the right of FIG. 5.

The overcurrent detection circuit 222 (refer to FIG. 2) determines whether the voltage level of the clock signal CKV is higher than the overcurrent reference current level OCP_L at a detection time point after a first time elapses from the rising time point of the clock control signal CPV (refer to FIG. 2) by a first time. The detection time point may have a predetermined distribution.

For instance, the first time may be about 4.5 µs and the distribution may be about 20%, but they are not limited thereto. Although the first time set as the detection time point is about 4.5 µs, the overcurrent detection circuit 222 (refer to FIG. 2) may determine whether the overcurrent occurs at a time point within a detection period DPN between about 3.6 µs to about 5.4 µs due, for example, to the distribution.

When a detectable period DT1 in the active period AP is about 4.2 µs from the rising time point of the clock control signal CPV (refer to FIG. 2), the normal output current CKVN_C and the abnormal output current CKVE_C are lower than the overcurrent reference current level OCP_L within a range from about 4.2 µs to about 5.4 µs. Accordingly, it may not be determined whether the overcurrent occurs. In addition, when the overcurrent reference current level OCP_L is lowered to detect the overcurrent, the normal output current CKVN_C may be determined as the overcurrent. For example, when a voltage level of the gate-on voltage increases to compensate for degradation of driving ability of inner driving elements at a low temperature, the normal output current CKVN_C may be erroneously determined as an overcurrent.

According to an exemplary embodiment of the present inventive concept, the phase difference between the first and second clock control signals CPV1 and CPV2 in the blank period BP is greater than the phase difference between the first and second clock control signals CPV1 and CPV2 in the active period AP. Accordingly, a time point at which a difference in voltage level between the first blank clock signal CKVB1 and the second blank clock signal CKVB2 is reduced by half may be later than a time point at which a difference in voltage level between the first active clock signal CKVA1 and the second active clock signal CKVA2 is reduced by half. In other words, the detectable period DT2 in the blank period BP may be longer than the detectable period DT1 in the active period AP. For example, the detectable period DT2 in the blank period BP may be two times longer than the detectable period DT1 in the active period AP. In other words, the detectable period DT2 may be equal to or greater than about 8.4 µs. Accordingly, the detection period DPN between about 3.6 µs and about 5.4 µs may completely overlap with the detectable period DT2. In other words, the detection period DPN may be included in the detectable period DT2. Accordingly, the reliability of the overcurrent detection may be increased.

Figure 6:
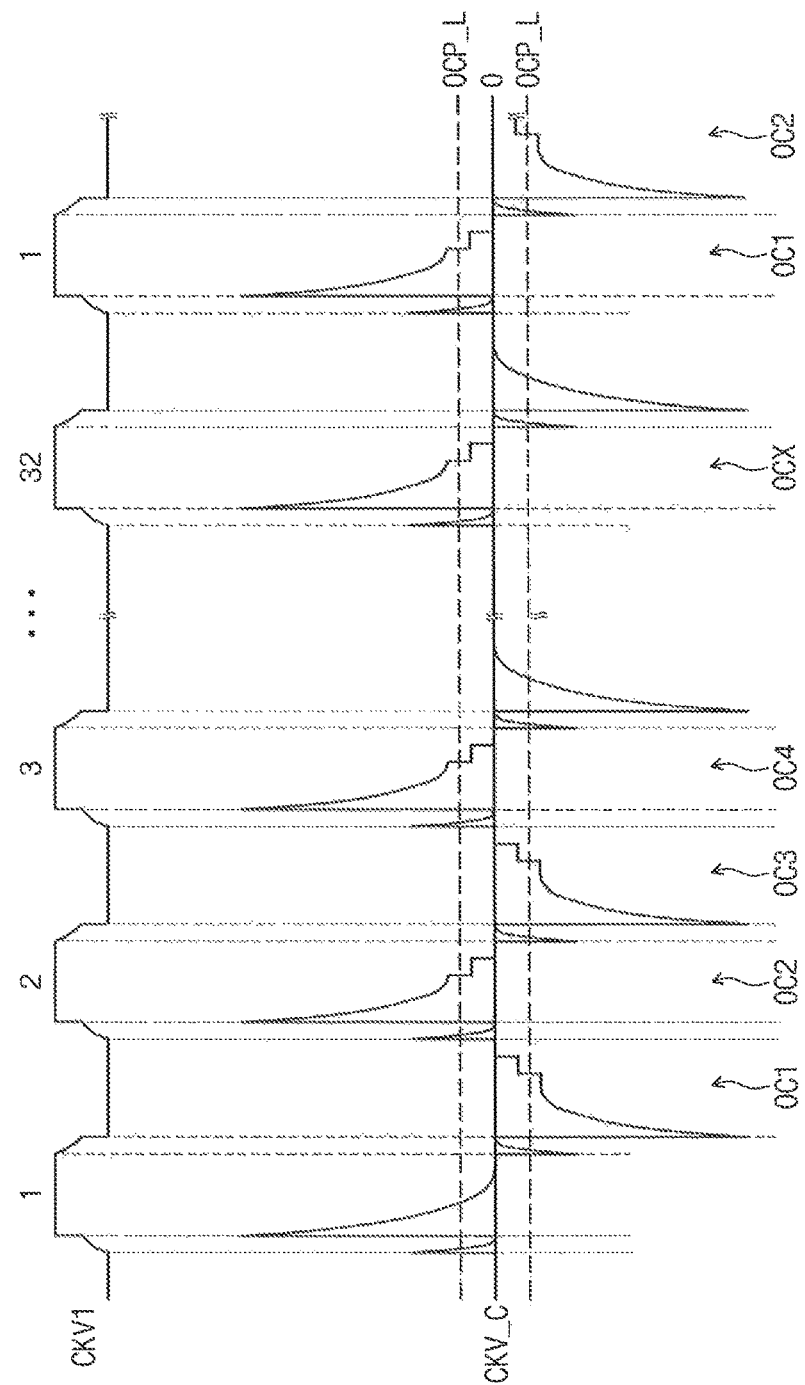
FIG. 6 is a timing diagram explaining a method of detecting an overcurrent according to an exemplary embodiment of the present inventive concept.

FIG. 6 is a timing diagram explaining a method of detecting the overcurrent according to an exemplary embodiment of the present inventive concept.

FIG. 6 shows the first clock signal CKV1 and the output current CKV_C with respect to the first clock signal CKV1.

Referring to FIGS. 3 and 6, the current sensor 222a senses the output current CKV_C. The overcurrent detector 222b determines whether the voltage level of the output current CKV_C is higher than the overcurrent reference current level OCP_L.

The overcurrent counter 222c counts the signal, which indicates that the level of the output current CKV_C is higher than the overcurrent reference current level OCP_L, output from the overcurrent detector 222b. The overcurrent counter 222c is initialized every predetermined period. As an example, the overcurrent counter 222c counts the overcurrent during thirty two (32) rising edges of the first clock signal CKV1, initializes the counted number, and counts again the overcurrent during another thirty two (32) rising edges of the first clock signal CKV1. The counting of the overcurrent for thirty two (32) rising edges is merely an example, and thus, the period for such counting may be shorter or longer than thirty two (32) rising edges of the first clock signal CKV1. In addition, the overcurrent counter 222c may be initialized each time a frame is finished. The initialization time point of the overcurrent counter 222c may be variously changed.

The overcurrent determination circuit 222d determines that the current of the clock signal is in the overcurrent state when the number of overcurrents counted by the overcurrent counter 222c exceeds the number of reference counts. FIG. 6 shows the number of times OC1, OC2, OC3, and OCX, in which the overcurrent is detected in thirty two (32) rising edges of the first clock signal CKV1. As an example, when the number of reference counts is eight (8), the overcurrent determination circuit 222d determines that the current of the clock signal is in the overcurrent state when "X" of "OCX" exceeds eight (8). In addition, the overcurrent determination circuit 222d determines that the current of the clock signal is in the normal state when "X" of "OCX" is equal to or smaller than eighth (8). However, the number of reference counts is not limited to eight (8).

Figure 7:
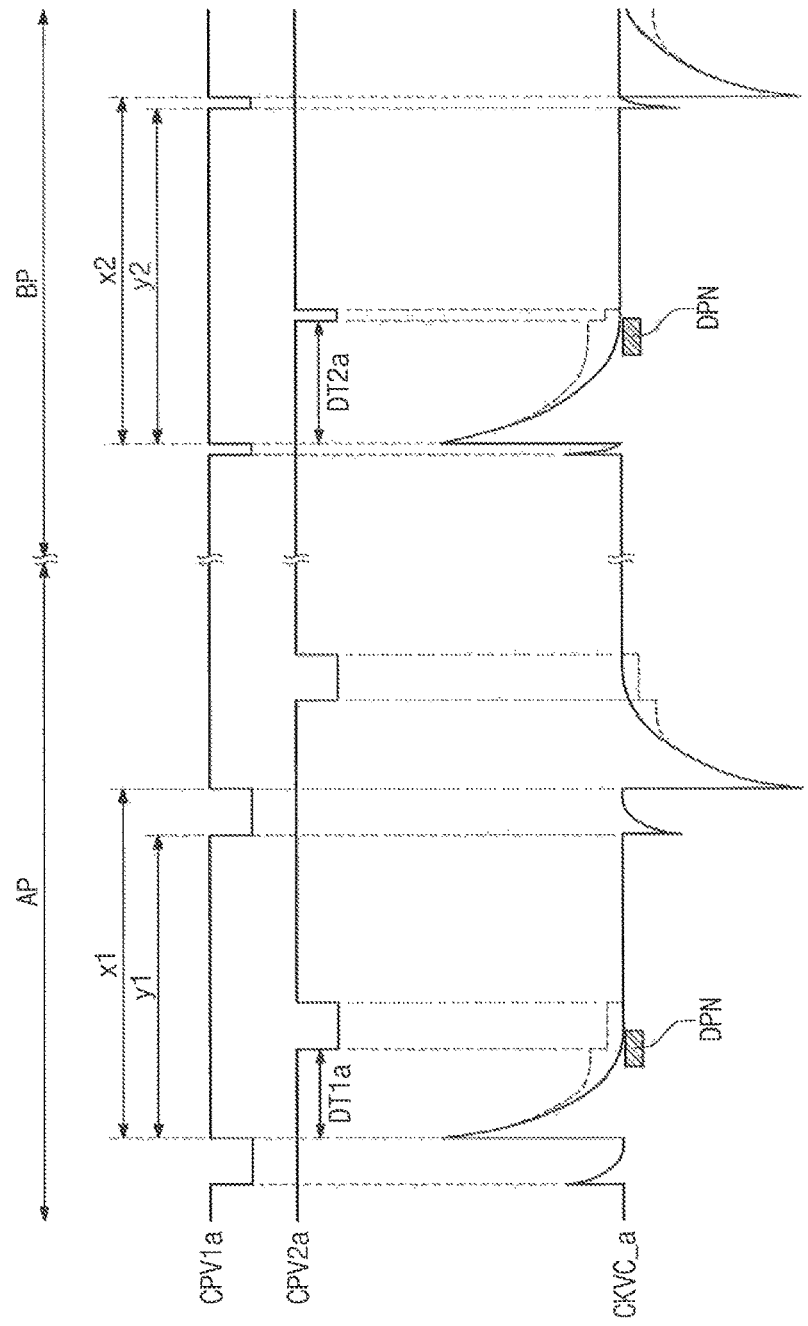
FIG. 7 is a timing diagram showing clock control signals and a current level of a clock signal according to an exemplary embodiment of the present inventive concept.

FIG. 7 is a timing diagram showing clock control signals and a current level of a clock signal according to an exemplary embodiment of the present inventive concept.

FIG. 7 shows a first clock control signal CPV1a, a second clock control signal CPV2a, 2') and a current CKVC_a of a first clock signal. Hereinafter, different features of the first clock control signal CPV1a and the second clock control signal CPV2b from those of the first clock control signal CPV1 (refer to FIG. 5) and the second clock control signal CPV2 (refer to FIG. 5) will be mainly described.

A duty ratio of each of the first clock control signal CPV1a and the second clock control signal CPV2a in the active period AP is different from a duty ratio of each of the first clock control signal CPV1a and the second clock control signal CPV2a in the blank period BP. The first clock control signal CPV1a will be described as a representative example.

In the active period AP, a period of the first clock control signal CPV1a is "x1", and a length of a period in which the first clock control signal CPV1a has a high level is "y1". Accordingly, a first duty ratio of the high level of the first clock control signal CPV1a in the active period AP is "y1/x1". In the blank period BP, the period of the first clock control signal CPV1a is "x2", and the length of the period in which the first clock control signal CPV1a has the high level is "y2". Accordingly, a second duty ratio of the high level of the first clock control signal CPV1a in the blank period BP is "y2/x2". "x1" may be the same as the "x2", and "y2" may be longer than the "y1". Accordingly, the second duty ratio may be greater than the first duty ratio.

After a time point of entry into the blank period BP, a falling time point of each of the first clock control signal CPV1a and the second clock control signal CPV2a may be delayed. Accordingly, a high level period of each of the first clock control signal CPV1a and the second clock control signal CPV2a may increase and, as a result, a detectable period DT2a in the blank period BP may be longer than a detectable period DT1a in the active period AP. The detectable period DT2a may be controlled to completely overlap with the detection period DPN. In other words, the entire detection period DPN may occur in the detectable period DT2a.

Figure 8:
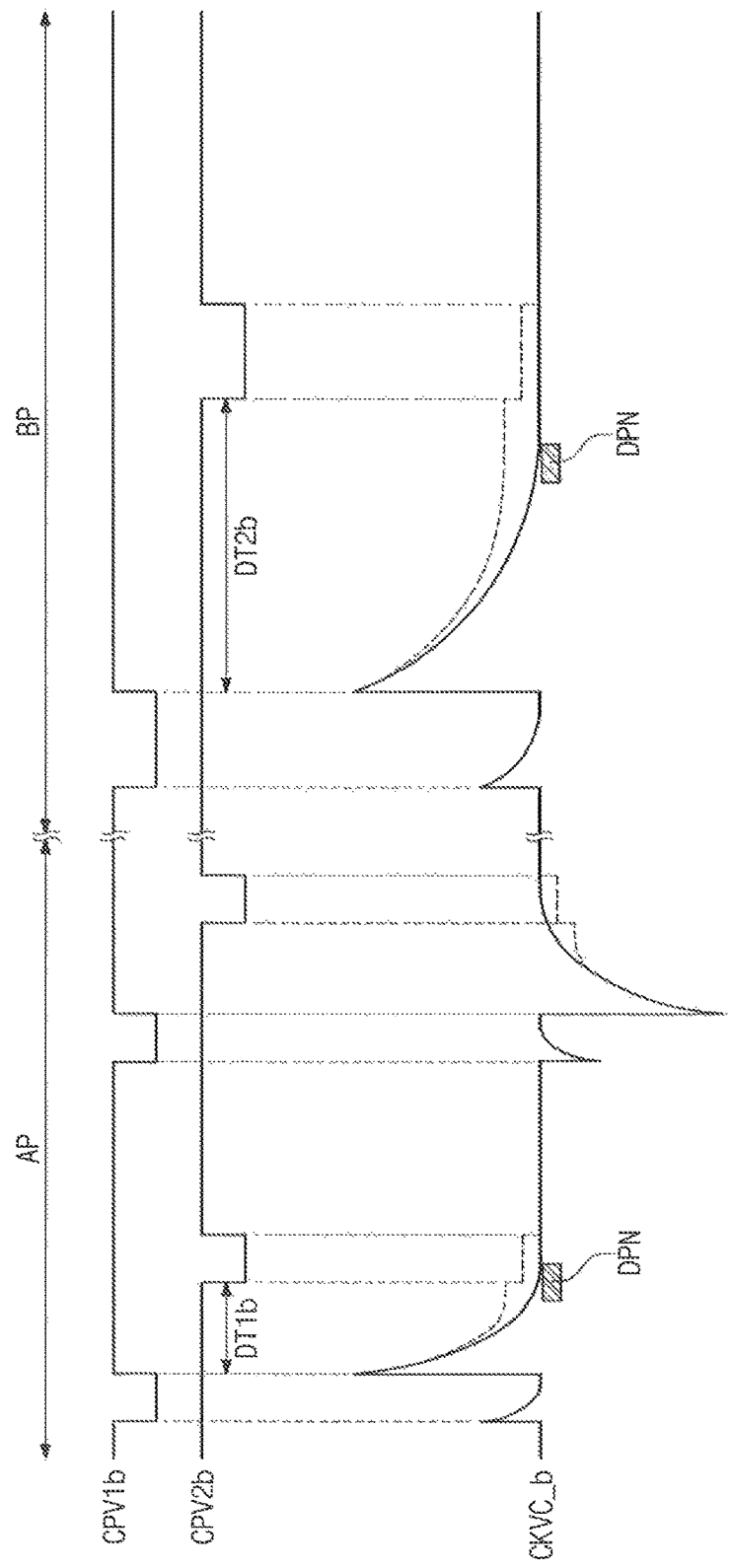
FIG. 8 is a timing diagram showing clock control signals and a current level of a clock signal according to an exemplary embodiment of the present inventive concept.

FIG. 8 is a timing diagram showing clock control signals and a current level of a clock signal according to an exemplary embodiment of the present inventive concept.

FIG. 8 shows a first clock control signal CPV1b, a second clock control signal CPV2b, and a current CKVC_b of a first clock signal. Hereinafter, different features of the first clock control signal CPV1b and the second clock control signal CPV2b from those of the first clock control signal CPV1 (refer to FIG. 5) and the second clock control signal CPV2 (refer to FIG. 5) will be mainly described.

A frequency of each of the first clock control signal CPV1b and the second clock control signal CPV2b in the active period AP is different from a frequency of each of the first clock control signal CPV1b and the second clock control signal CPV2b in the blank period BP.

After a time point of entry into the blank period BP, a frequency of each of the first clock control signal CPV1b and the second clock control signal CPV2b may be changed. For example, the frequency of each of the first clock control signal CPV1b and the second clock control signal CPV2b may be lowered. As a result, a detectable period DT2b in the blank period BP may be longer than a detectable period DT1a in the active period AP. The detectable period DT2b may be controlled to completely overlap with the detection period DPN. In other words, the entire detection period DPN may occur within the detectable period DT2b.

Figure 9:
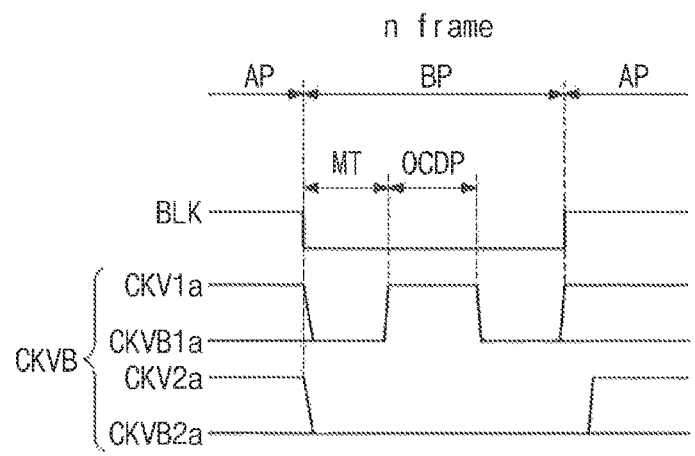
FIG. 9 is a timing diagram showing clock signals output during a blank period according to an exemplary embodiment of the present inventive concept.

FIG. 9 is a timing diagram showing clock signals output during the blank period according to an exemplary embodiment of the present inventive concept.

In FIG. 5, the first and second blank clock signals CKVB1 and CKVB2 are output in synchronization with the first and second clock control signals CPV1 and CPV2 in the blank period BP. When compared with FIG. 5, in FIG. 9, each of the blank clock signals CKVB may be output in the blank period BP independently of the clock control signals.

FIG. 9 shows a blank signal BLK and a plurality of blank clock signals CKVB. The blank signal BLK may be activated during the blank period BP. In FIG. 9, the blank signal BLK is activated when the blank signal BLK has a low level.

The blank clock signals CKVB may include a first blank clock signal CKV1a, a first blank clock bar signal CKVB1a, a second blank clock signal CKV2a, and a second blank clock bar signal CKVB2a. However, the blank clock signals CKVB according to the present inventive concept are not limited to those shown in FIG. 9.

The first blank clock signal CKV1a and the second blank clock signal CKV2a may be signals output to wirings adjacent to each other in the display panel 100 (refer to FIG. 1). In addition, the first blank clock bar signal CKVB a and the second blank clock bar signal CKVB2a may be signals output to wirings adjacent to each other in the display panel 100 (refer to FIG. 1).

Referring to the first blank clock signal CKV a and the second blank clock signal CKV2a, the first blank clock signal CKV1a is the signal output to the first gate line GL1 (refer to FIG. 1) and the second blank clock signal CKV2a is the signal output to the second gate line adjacent to the first gate line GL1 (refer to FIG. 1).

The first blank clock signal CKV1a and the second blank clock signal CKV2a may have different voltage levels from each other, and the first blank clock bar signal CKVB1a and the second blank clock bar signal CKVB2a may have different voltage levels from each other. The first blank clock signal CKV1a and the first blank clock bar signal CKVB1a may have opposite phases to each other in the active period AP, but may have the same phase as each other in the blank period BP.

As an example, the first blank clock signal CKV1a may have the high level, and the second blank clock signal CKV2a may have the low level in a portion of the blank period BP. The high level may be the gate-on voltage, and the low level may be the gate-off voltage. In other words, signals applied to wirings adjacent to each other may have different voltage levels from each other. Since there is a relatively high probability that the wirings or the voltage terminals adjacent to each other are short-circuited to each other, the overcurrent may be more easily detected by outputting the signals having different voltage levels from each other to the wirings adjacent to each other.

For example, the blank period BP may include a masking period MT and an overcurrent detecting period OCDP. When the active period AP is changed to the blank period BP, the current flowing through the voltage terminal may be maintained at a stable level after the predetermined time elapses. Accordingly, the overcurrent is detected after the masking period MT. This way, a noise component of a current observed during the predetermined time is not mistaken for an overcurrent.

Accordingly, the first blank clock signal CKV1a, the second blank clock signal CKV2a, the first blank clock bar signal CKVB1a, and the second blank clock bar signal CKVB2a have the low level during the masking period MT. During the overcurrent detecting period OCDP, the first blank clock signal CKV1a and the second blank clock signal CKV2a have different voltage levels from each other, and the first blank clock bar signal CKVB1a and the second blank clock bar signal CKVB2a may have different voltage levels from each other. When the voltage generator 221 (refer to FIG. 2) generates the blank clock signals CKVB during the blank period BP, the voltage generation circuit 220 (refer to FIG. 1) may receive the clock control signal CPV shown in FIG. 4 or the clock control signals CPV1a and CPV1b shown in FIG. 7.

Figure 10:
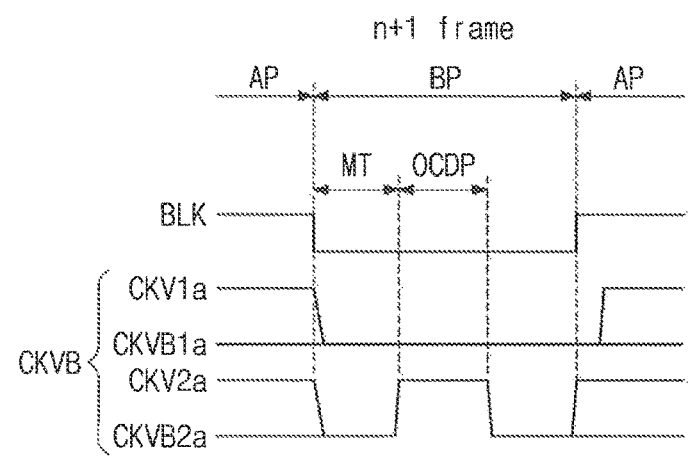
FIG. 10 is a timing diagram showing clock signals output during a blank period according to an exemplary embodiment of the present inventive concept.

FIG. 10 is a timing diagram showing clock signals output during a blank period according to an exemplary embodiment of the present inventive concept.

FIG. 10 shows a first blank clock signal CKV1a, a first blank clock bar signal CKVB1a, a second blank clock signal CKV2a, and a second blank clock bar signal CKVB2a of an (n+1)th frame. FIG. 9 shows these signals in an n-th frame, for example.

Referring to FIGS. 9 and 10, the first blank clock signal CKV1a, the first blank clock bar signal CKVB1a, the second blank clock signal CKV2a, and the second blank clock bar signal CKVB2a of the (n+1)th frame are output at voltages obtained by inverting the voltages of the first blank clock signal CKV1a (refer to FIG. 9), the first blank clock bar signal CKVB1a (refer to FIG. 9), the second blank clock signal CKV2a (refer to FIG. 9), and the second blank clock bar signal CKVB2a (refer to FIG. 9) of the n-th frame. When the display panel 100 (refer to FIG. 1) is the liquid crystal display panel, and the blank clock signals are inverted every frame as described with reference to FIG. 10, the pixels can be prevented from burning and deteriorating.

Although the inventive concept has been shown and described with reference to exemplary embodiments thereof, it is understood by those of ordinary skill in the art that various changes in form and detail can be made thereto without departing from the spirit and scope of the inventive concept as hereinafter claimed.

What is claimed is:

1. A display device, comprising:
    a display panel comprising a plurality of data lines, a plurality of gate lines, and a plurality of pixels, wherein the display panel is operated in an active period in which a data driving signal is applied to the pixels through the data lines or in a blank period in which the data driving signal is not applied to the pixels; and
    a driving circuit for driving the display panel, the driving circuit comprising:
        a signal controller for outputting a plurality of clock control signals;
        a voltage generator for receiving the clock control signals, wherein the voltage generator outputs a plurality of active clock signals synchronized with the clock control signals during the active period and outputs a plurality of blank clock signals during the blank period; and
        an overcurrent detection circuit for receiving the clock control signals and the blank clock signals, wherein the overcurrent detection circuit detects an overcurrent of the blank clock signals, and wherein a phase difference between the clock control signals in the active period is different from a phase difference between the clock control signals in the blank period.

2. The display device of claim 1, wherein, when a rising time point of a first clock control signal is a first rising time point and a rising time point of a second clock control signal that rises at a time point nearest to and after the first rising time point is a second rising time point, a first time difference between the first rising time point and the second rising time point in the active period is smaller than a second time difference between the first rising time point and the second rising time point in the blank period.

3. The display device of claim 2, wherein, after the blank period is entered, the second clock control signal first rises after a first delay time and a third clock control signal subsequent to the second clock control signal first rises after a second delay time.

4. The display device of claim 2, wherein each of the first and second clock control signals has a low level for a time equal to or greater than the first time difference of the blank period before the active period begins.

5. The display device of claim 2, wherein a duty ratio of a high level of each of the first and second clock control signals in the active period is smaller than a duty ratio of a high level of each of the first and second clock control signals in the blank period.

6. The display device of claim 2, wherein the overcurrent detection circuit detects the overcurrent during a time between the first rising time point and a falling time point of the second clock control signal that falls at a time point nearest to and after the first rising time point.

7. The display device of claim 6, wherein the overcurrent detection circuit counts a signal at a detection time after a first time elapses from the first rising time point, wherein the counted signal indicates that a current level of a first clock signal is higher than an overcurrent reference current level.

8. The display device of claim 7, wherein the detection time is a detection period, and the detection period is a period between the first rising time point and the falling time point in the blank period.

9. The display device of claim 1, wherein the blank clock signals comprise a first blank clock signal and a second blank clock signal, and the first blank clock signal has a voltage level different from a voltage level of the second blank clock signal.

10. The display device of claim 9, wherein the blank period comprises a masking period and an overcurrent detection period, the blank clock signals have a low level during the masking period, and the first blank clock signals has a high level and the second blank clock signals has a low level during the overcurrent detection period.

11. The display device of claim 9, wherein the first blank clock signal in a first frame and the second blank clock signal in a second frame have a same level as each other, and the second blank clock signal in the first frame and the first blank clock signal in the second frame have a same level as each other.

12. The display device of claim 1, wherein the overcurrent detection circuit counts a number of overcurrent detections and activates an overcurrent detection signal when the number of overcurrent detections is equal to or greater than a reference number, and the voltage generator stops generating a driving voltage in response to the overcurrent detection signal.

13. A display device, comprising:
a display panel comprising a plurality of data lines, a plurality of gate lines, and a plurality of pixels, wherein the display panel is operated in an active period in which a data driving signal is applied to the pixels through the data lines or in a blank period in which the data driving signal is not applied to the pixels; and
a driving circuit for driving the display panel, the driving circuit comprising:
a signal controller for outputting a plurality of clock control signals;
a voltage generator for receiving the clock control signals, wherein the voltage generator outputs a plurality of active clock signals synchronized with the clock control signals during the active period and outputs a plurality of blank clock signals during the blank period; and
an overcurrent detection circuit for receiving the clock control signals and the blank clock signals, wherein the overcurrent detection circuit detects an overcurrent of the blank clock signals, wherein a time difference between a rising time point of a first clock control signal and a falling time point of a second clock control signal that falls at a time point nearest to and after the rising time point is greater in the blank period than in the active period.

14. The display device of claim 13, wherein a frequency of each of the first and second clock control signals in the blank period is lower than a frequency of each of the first and second clock control signals in the active period.

15. The display device of claim 13, wherein a phase difference between each of the first and second clock control signals in the active period is different from a phase difference between each of the first and second clock control signals in the blank period.

16. A method of driving a gate driver of a display panel that comprises a plurality of data lines, a plurality of gate lines, and a plurality of pixels, wherein the display panel is operated in an active period in which a data driving signal is applied to the pixels through the data lines or in a blank period in which the data driving signal is not applied to the pixels, the method comprising:
receiving a plurality of clock control signals having phase differences different from each other in the active period and the blank period;
generating a plurality of active clock signals synchronized with the clock control signals in the active period;
generating a plurality of blank clock signals in the blank period;
detecting an overcurrent of the blank clock signals in response to the clock control signals and the blank clock signals; and
activating an overcurrent detection signal when a number of overcurrent detections exceeds a reference number.

17. The method of claim 16, wherein, after the blank period is entered, each of first, second and third clock control signals has a first rise time, and the first rise time of each of the second and third clock control signals is delayed.

18. The method of claim 16, wherein a first duty ratio of a high level of the clock control signals in the active period is smaller than a second duty ratio of a high level of the clock control signals in the blank period.

19. The method of claim 16, wherein the blank clock signals are generated in synchronization with the clock control signals in the blank period.

20. The method of claim 16, wherein the generating of the blank clock signals comprises:
generating a first blank clock signal having a first voltage level; and
generating a second blank clock signal having a second voltage level different from the first voltage level.

* * * * *